United States Patent
Scheck et al.

(10) Patent No.: US 7,123,889 B2
(45) Date of Patent: Oct. 17, 2006

(54) RADIO TRANSMITTER TESTING METHOD, RADIO TRANSMITTER AND BASE STATION

(75) Inventors: Hans-Otto Scheck, Espoo (FI); Pekka Kukkonen, Oulu (FI); Timo Poranen, Oulu (FI)

(73) Assignee: Nokia Corporation, Espoo (FI)

( * ) Notice: Subject to any disclaimer, the term of this patent is extended or adjusted under 35 U.S.C. 154(b) by 404 days.

(21) Appl. No.: 10/794,023

(22) Filed: Mar. 8, 2004

(65) Prior Publication Data
US 2005/0130610 A1 Jun. 16, 2005

(30) Foreign Application Priority Data
Dec. 10, 2003 (FI) .................................. 20031805

(51) Int. Cl.
*H03C 1/62* (2006.01)
(52) U.S. Cl. .................. 455/115.1; 455/126; 455/67.11
(58) Field of Classification Search .............. 455/115.1
See application file for complete search history.

(56) References Cited

U.S. PATENT DOCUMENTS

| | | | |
|---|---|---|---|
| 6,912,377 B1 * | 6/2005 | Hayashihara | 455/115.1 |
| 6,917,389 B1 * | 7/2005 | Lee | 348/608 |
| 2002/0085647 A1 * | 7/2002 | Oishi et al. | 375/297 |
| 2004/0232986 A1 * | 11/2004 | Hirose et al. | 330/149 |
| 2005/0226346 A1 * | 10/2005 | Ode et al. | 375/296 |

OTHER PUBLICATIONS

Proakis et al, "Introduction to Digital Signal Processing", Chapter 8: Design of Digital Filters, Macmillan Publishing Company, 1989, pp. 544-584.
Proakis et al, "Introduction to Digital Signal Processing", Chapter 9: The Discrete Fourier Transform: Its Properties and Computation; Macmillan Publishing Company, 1989, pp. 682-719.

* cited by examiner

*Primary Examiner*—Rafael Perez-Gutierrez
*Assistant Examiner*—RuiMeng Hu
(74) *Attorney, Agent, or Firm*—Squire, Sanders & Dempsey, LLP.

(57) ABSTRACT

A radio transmitter, comprising: a feedback loop (314) which feedback loop comprises a variable attenuator and a signal analyser, means (300, 302, 304, 306, 308, 310, 312) for transmitting a signal on a predetermined radio channel, means (308) for changing attenuation level and for attenuating the feedback signal, means (316) for defining power levels on the radio channel and on the adjacent channels, means (312) for analysing the power levels to generate first and second results of analysis and for comparing the first and second results of analysis, means (318) for delaying a transmitted signal to derive a reference signal, means (312) for comparing the feedback signal and the reference signal to generate an error vector and means (320) for generating a test alarm.

16 Claims, 2 Drawing Sheets

Figure 1:
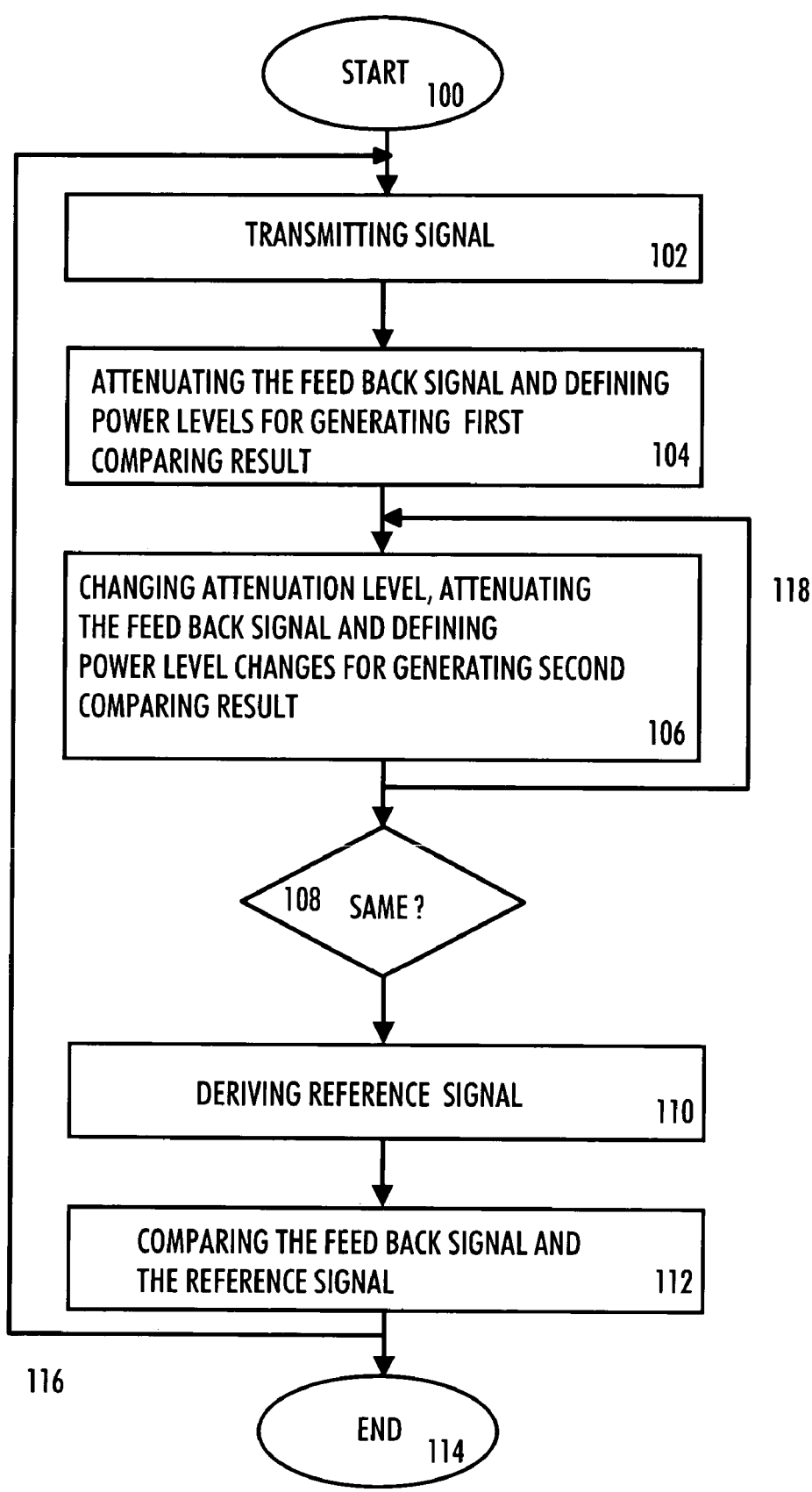

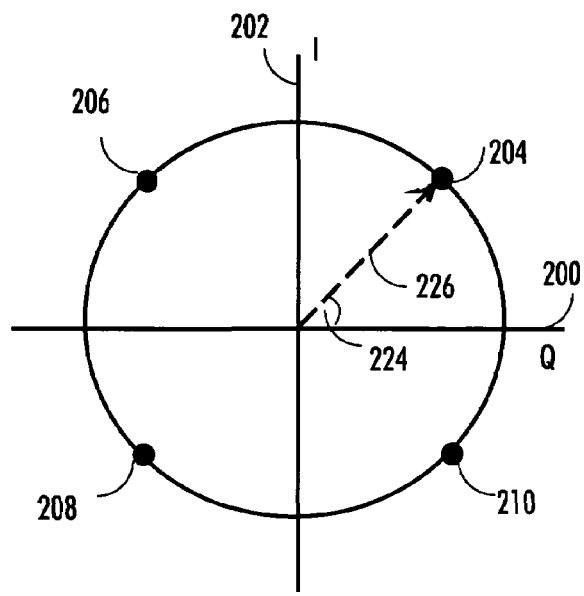
FIG. 2A
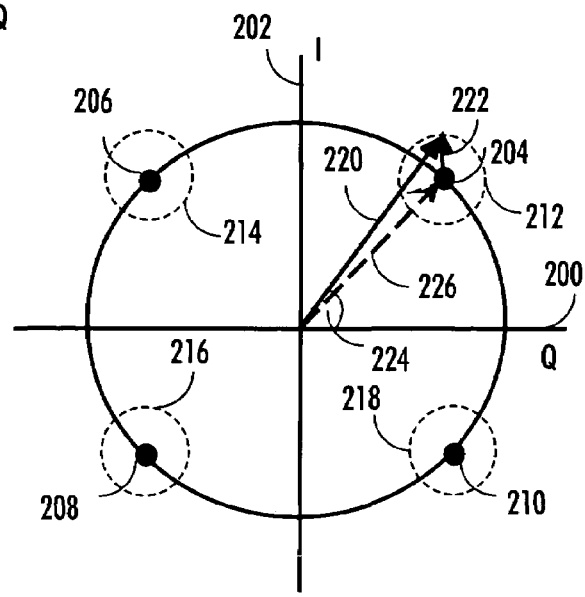
FIG. 2B
FIG. 3
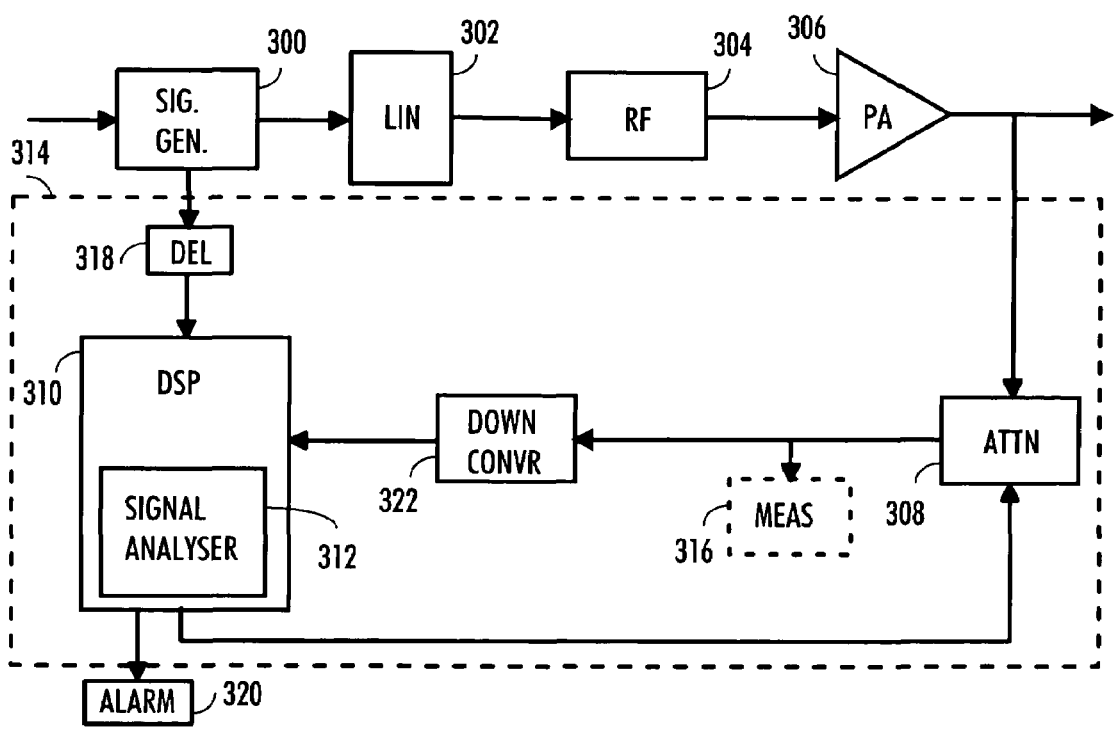

RADIO TRANSMITTER TESTING METHOD, RADIO TRANSMITTER AND BASE STATION

FIELD

The invention relates to a radio transmitter testing method, a radio transmitter and a base station.

BACKGROUND

The linearity requirements for radio transmitters usually require a linearized transmitter because power amplifiers are typically linear only in a limited power range. Power amplifiers are required in radio telecommunication systems to amplify signals before transmitting, because a radio signal attenuates on the radio path. Unfortunately, high-power radio-frequency amplifiers tend to be non-linear devices and therefore in many cases they cause distortion. This distortion is expressed, for example, as Inter-Symbol-Interference or out-off-band power in adjacent frequency bands. Typically in many radio communication systems, there are limitations in specifications for power leakage. Another problem which arises with power amplifiers is that the power adjustment is not accurate enough.

Therefore, it is important to find out the transmitters which do not fulfil the quality requirements by measuring and analysing transmitted signals. A testing method and arrangement suitable for production and in situ testing is especially important.

BRIEF DESCRIPTIONS OF THE INVENTION

An object of the invention is to provide an improved radio transmitter testing method and a radio transmitter. According to an aspect of the invention, there is provided a radio transmitter testing method, testing a radio transmitter comprising a feedback loop which feedback loop comprises a variable attenuator and a signal analyser, the method comprising: transmitting a signal on a predetermined radio channel and conveying the transmitted signal to the feed-back loop to generate a feed-back signal attenuating the feed-back signal by the attenuator, defining power levels on the radio channel and on the predetermined adjacent channels and analysing the power levels by the signal analyser for generating a first result of analysis, changing attenuation level, attenuating the feed-back signal by the attenuator, defining power levels on the radio channel and on the predetermined adjacent channels and analysing the power levels by the signal analyser for generating a second result of analysis, if the first and the second results of analysis are not the same, a test alarm is generated, otherwise delaying a transmitted signal to derive a reference signal, comparing the feed-back signal and the reference signal to generate an error vector and if the error vector is not fulfilling a predetermined criteria, a test alarm is generated.

According to another aspect of the invention, there is provided a radio transmitter, comprising: a feedback loop which feedback loop comprises a variable attenuator and a signal analyser, means for transmitting a signal on a predetermined radio channel, means for changing attenuation level and for attenuating the feedback signal, means for defining power levels on the radio channel and on the adjacent channels, means for analysing the power levels to generate first and second results of analysis and for comparing the first and second results of analysis, means for delaying a transmitted signal to derive a reference signal, means for comparing the feedback signal and the reference signal to generate an error vector and means for generating a test alarm.

According to another aspect of the invention, there is provided a radio transmitter, comprising: a feedback loop which feedback loop comprises a variable attenuator and a signal analyser, transmitting means transmitting a signal on a predetermined radio channel, attenuating means changing attenuation level and attenuating the feedback signal, defining means defining power levels on the radio channel and on the adjacent channels, analysing means analysing the power levels to generate first and a second results of analysis and for comparing the first and second results of analysis, delaying means delaying a transmitted signal to derive a reference signal, comparing means comparing the feed-back signal and the reference signal to generate an error vector, alarming means generating a test alarm.

According to another aspect of the invention, there is provided a base station, comprising: a feedback loop which feedback loop comprises a variable attenuator and a signal analyser, means for transmitting a signal on a predetermined radio channel, means for changing attenuation level and for attenuating the feedback signal, means for defining power levels on the radio channel and on the adjacent channels, means for analysing the power levels to generate first and second results of analysis and for comparing the first and second results of analysis, means for delaying a transmitted signal to derive a reference signal, means for comparing the feed-back signal and the reference signal to generate an error vector and means (320) for generating a test alarm.

According to another aspect of the invention, there is provided a base station comprising: a feedback loop which feedback loop comprises a variable attenuator and a signal analyser, transmitting means transmitting a signal on a predetermined radio channel, attenuating means changing attenuation level and attenuating the feedback signal, defining means defining power levels on the radio channel and on the adjacent channels, analysing means analysing the power levels to generate first and second results of analysis and for comparing the first and second results of analysis, delaying means delaying a transmitted signal to derive a reference signal, comparing means comparing the feed-back signal and the reference signal to generate an error vector, alarming means generating a test alarm.

Further embodiments of the invention are described in the dependent claims.

The method and system of the invention provide several advantages. In a preferred embodiment of the invention, the transmitter can be monitored while in operation. Less test equipment than in a typical prior art testing method and arrangement is also needed.

LIST OF DRAWINGS

In the following, the invention will be described in greater detail with reference to the preferred embodiments and the accompanying drawings, in which FIG. 1 is a flow chart, FIG. 2 shows an example of EVM calculation, and FIG. 3 illustrates a block diagram of a transmitter with a feedback loop.

DESCRIPTION OF EMBODIMENTS

FIG. 1 is a flow chart showing one embodiment of the radio transmitter testing method. The method is applicable to radio transmitters used in different kinds of communication systems such as UMTS or GSM, for example. The method is applicable, for instance, to production testing, in situ testing and testing during development of radio transmitters.

The embodiment is designed for testing a radio transmitter comprising a feedback loop, which feedback loop comprises a variable attenuator and a signal analyser. An attenuator and a signal analyser may be added to a conventional feedback loop. The attenuator can be implemented in many ways. It may, for instance, be a prior art step attenuator or a prior art multi-step attenuator. The attenuator is adjustable (or variable) for changing the attenuation level.

Also the signal analyser can be implemented in many ways. The signal analyser may be a spectrum analyser, for instance. It can be implemented, for instance, by an FFT processor (Fast Fourier Transform). The FFT is an efficient way to compute DFT (Discrete Fourier Transform). There are several widely used FFT algorithms such as radix-2 and radix-4 algorithms. In computing FFT of a signal, decimation-in-time or decimation-in-frequency is typically used.

FFT algorithms while used in a signal analyser, are used for spectrum analysis. FFT algorithms are known in the art and they are explained in further detail in Introduction to Digital Signal Processing, John G. Proakis, Dimitris G. Manolakis, Macmillan Publishing Company, 1989, Chapter 9 pages 682–719 which is incorporated herein by reference.

The analyser can also be implemented by a digital filter or a filter bank. Digital filters are typically grouped into two classes: FIR (Finite Impulse Response) or IIR (Infinite Impulse Response) filters. The filters used can be of tunable or fixed type. Typically, fixed filters are used in filter banks. In a filter design process, coefficients of a causal FIR or IIR filter are specified in a way that the filters approximate the desired magnitude and phase response. In practice, FIR filters are employed when linear phase characteristics within the pass-band of a filter are required. In this embodiment, a linear filter is preferred and therefore a FIR filter is typically used.

In a tunable filter, the pass-band of a filter can be tuned by adjusting filter coefficients (also called tap coefficients). Thus the filter can be adjusted to different radio channels.

In a filter bank, there are a plurality of filters, typically fixed filters, each of which is designed for a predetermined radio channel.

Filter designing is also known in the art and explained in further detail in Introduction to Digital Signal Processing, John G. Proakis, Dimitris G. Manolakis, Macmillan Publishing Company, 1989, Chapter 8 pages 544–584, which is incorporated herein by reference.

The feed back loop is explained later by the aid of the example depicted in FIG. 3.

A typical spectrum analyser is a broadband receiver and therefore it generates spurious signals itself. These spurious signals are not readily distinguishable from the signal to be measured. One method used is based on the fact that all signals from an external source change their amplitude proportional to the gain or attenuation of the input stage. Internally generated distortion, however, changes typically with the order of the inter-modulation product: a third order product generated in the analyser increases three times faster than an external signal, if the gain or attenuation is changed. The $3^{rd}$ and $5^{th}$ order inter-modulation products of the transmitted signal are on the first and second adjacent channels of the transmission channel used, in other words, they are the most important ones in view of the operation of the system.

The embodiment starts in block 100. In block 102, a signal is transmitted on a predetermined radio channel and conveyed to the feed back loop to generate a feed back signal.

In block 104, the feed back signal is attenuated by the attenuator, the power level on the radio channel and on predetermined adjacent channels are defined and the power levels are analysed by the signal analyser for generating a reference values for later analysis. In other words, the feedback signal is attenuated by the attenuator, power levels on the radio channel and on the predetermined adjacent channels are defined and the power levels are analysed by the signal analyser for generating a first result of analysis. The power levels are typically defined by measuring.

The attenuator on the feed back path causes both the wanted signal (in other words, the signal on a predetermined radio channel) and the distortion signals (selected adjacent channel signals) to change.

In block 106, the level of attenuation is changed, the feed back signal is attenuated by the attenuator, the power levels on the radio channel and on the selected adjacent channels are defined again and the power levels are analysed by the signal analyser for generating a second result of analysis. The power levels are typically defined by measuring.

In one embodiment, the adjacent channel leakage ratio (ACLR) test can be generated to achieve the first and the second result of analysis. Then the power of the measured transmitted signal (the transmitted signal may be the regular transmitter signal or a dedicated test signal) is changed by an attenuator. The power level on the selected channel is compared with the power levels on the selected adjacent channels by a spectrum analyser. If the powers change proportionally (the ACLR remains constant), the adjacent signal powers are due to the transmitter chain and the feedback loop is working properly, but if the change is faster on the adjacent channels (which means the measured ACLR is changing), the distortion is generated by the feedback loop and the transmitted signal might be corrupted.

In block 108, the first and second results of analysis are compared and if they are not the same, a test alarm is generated. For example, if the ACLR test is used, the analysed power ratios are compared. In the case of output power testing of the wanted channel, the gain settings of the transmitter chain are compared with the results obtained from the feedback path. A power sensor might be applied optionally, to further increase the accuracy of the test. A threshold detector may be used to generate an alarm, if a predetermined difference is exceeded.

If the compared results or power ratios are not the same, a second test phase is started. The second test phase is based on Error Vector Magnitude (EVM) test. When an EVM test is used, the signal received from the feedback path is compared (typically by amplitude and/or phase) with the original signal at the transmitters output. The resulting error vector is a measure for the modulation quality. A threshold detector may be used to generate an alarm if a predetermined value is exceeded.

In block 110, a transmitted signal is delayed to derive a reference signal. To improve the test quality, a gain difference between the transmitted signal and a feed back signal may be corrected by using a power meter.

In block 112, the feed back signal and the reference signal are compared to generate an error vector and if the error vector is not fulfilling predetermined criteria, a test alarm is generated. The criteria may be, for instance, a threshold for the maximum value of EVM. The measurement accuracy can be improved by repeated measurements with different power levels of the transmitted signal and with different attenuator settings.

The determination of the error vector magnitude will be described below with reference to the example depicted in FIGS. 2A–B. FIG. 2A shows a simple example of a signal space diagram, which illustrates the location of modulated symbols with respect to one another. The FIG. 2A shows an example of an original signal which is not yet distorted. The example shows a two-dimensional signal space diagram of a phase-modulated signal when the modulation comprises four levels. The system thus employs four different signals or pulse forms. In the example of FIG. 2A, points 204, 206, 208 and 210 denote different signals, or states of the signal space diagram. In the different states 204, 206, 208, 210 of the signal space diagram the phase of the signal varies. The number of the states in the signal space diagram varies in different modulation methods: the more states the greater the data transmission capacity of the system. As shown in FIG. 2A, the signal space diagram can be illustrated as a unit circle, but other possible manners of representation also exist. In the figure the horizontal axis 200 shows the quadrature component of the modulated signal and the vertical axis 202 shows the in-phase component. In other words, the signal is divided into in-phase and quadrature components.

In FIG. 2B, the circles 212, 214, 216, 218 denote the area where the signals represented by different symbols are actually located due to different types of distortion. A signal space diagram is formed such that the pointer diagrams of the different signals with specified phase differences are placed in the same diagram. The angle 224 denotes the phase of signal 204. The arrow 226 denotes an original signal vector at transmitter's input and the arrow 220 denotes a transmitted vector. An arrow 222 denotes a vector that represents the distance between the distortion-free location of a symbol and its actual location, it is called an error vector. The absolute value of this vector is called error vector magnitude (EVM). The EVM is a prior art indicator for the quality of modulation.

The embodiment ends in block 114. The arrow 116 depicts one possibility for repeating the embodiment. The arrow 118 depicts that it is possible to change the attenuation level several times before the results of analysis are compared. Thus it is possible to compare as many results of analysis as required.

FIG. 3 illustrates a block diagram of a transmitter according to an embodiment of the invention. The transmitter can be located in different kinds of communication equipment, such as a base station which is also called a node B, for example. The transmitter includes a feedback loop 314 according to the embodiment of the invention. The feedback loop with a variable attenuator and the build-in analyser enables identifying the origin of distortion without external text equipment. The attenuator and the signal analyser make it possible to identify the origin of distortion in the way described above.

The feedback loop includes a signal analyser 312 which in this embodiment is preferably implemented by software incorporated in DSP (Digital Signal Processing) block 310. Signal analyser may also be implemented by hardware as an ASIC (Application Specific Integrated Circuit) component, for instance. A hybrid of these different implementations is also feasible. The Digital Signal Processing block typically carries out several processes in a transmitter such as coding, encryption etc.

The signal analyser 312 may, for instance, compare the power level on the selected channel with the power levels on the selected adjacent channels. This is typically done by the ACLR test carried out in the signal analyser 312. The signal analyser may be, for instance, a spectrum analyser.

A typical spectrum analyser is a broadband receiver and therefore it generates spurious signals itself. These spurious signals are not readily distinguishable from the signal to be measured. One method used is based on the fact that all signals from an external source change their amplitude proportional to the gain or attenuation of the input stage. Internally generated distortion, however, changes typically with the order of the inter-modulation product: a third order product generated in the analyser increases three times faster than an external signal, if the gain or attenuation is changed. The $3^{rd}$ and $5^{th}$ order inter-modulation products of the transmitted signal are on the first and second adjacent channels of the transmission channel used, in other words, they are the most important ones in view of the operation of the system.

In the case of output power testing of the wanted channel, the gain settings of the transmitter chain (300, 302, 304, 306) are compared with the results obtained from the feedback path (308, 322, 312). A power sensor (316) might be applied optionally, to further increase the accuracy of the test. A threshold detector may be used to generate an alarm if a predetermined difference is exceeded.

A second test phase is also possible. The second test phase is based on an Error Vector Magnitude (EVM) test. When the EVM test is used, the signal received from the feedback path is compared (typically by amplitude and/or phase) with the original signal at the transmitters output. The resulting error vector is a measure for the modulation quality. A threshold detector may be used to generate an alarm if a predetermined value is exceeded.

The feedback loop includes also an attenuator 308. The attenuator can be implemented in many ways. It may be, for instance, a prior art step attenuator or a prior art multi-step attenuator. The attenuator is adjustable (or variable) for changing the attenuation level for analysing signal powers.

The transmitter includes a signal generator 300 which carries out different functions such as modulation, clipping etc. Different modulation and other signal processing functions are known in the art and therefore not explained here in greater detail. The transmitter also includes a linearization block 302 which is known to a person skilled in the art.

The transmitter also includes radio frequency (RF) parts 304. The RF-parts in this embodiment take care of digital-to-analogue (D/A) conversion and signal up-conversion to the transmission frequency, for instance.

The power amplifier 306 amplifiers the signal to be transmitted to the selected transmission power for the radio path. High-power radio-frequency amplifiers tend to be non-linear devices and therefore they cause distortion in many cases. This distortion is expressed, for example as out-of-band power in adjacent frequency bands. ACLR (Adjacent Carrier Leakage Ratio) quantifies the out-of-band transmitted power and thus it must remain within specified limits.

The transmitter in this embodiment also includes power measuring means 316 for defining power of the feed-back signal and delaying means 318 for delaying a generated signal to derive a reference signal for EVM testing. The reference signal is down-converted in block 322 to convert the RF-signal to a base-band frequency for processing.

The transmitter of FIG. 3 includes means 320 for generating a test alarm. The alarm may be a sound and/or a visual effect, for instance. The alarms are typically sent O&M (Operation and Maintenance) or MMI (Man Machine Interface).

Even though the invention is described above with reference to an example according to the accompanying drawings, it is clear that the invention is not restricted thereto but it can be modified in several ways within the scope of the appended claims.

The invention claimed is:

1. A radio transmitter testing method, for testing a radio transmitter comprising a feedback loop which feedback loop comprises a variable attenuator and a signal analyser, the method comprising:
   transmitting a signal on a predetermined radio channel, and conveying the transmitted signal to the feedback loop to generate a feed-back signal;
   attenuating the feed-back signal by the attenuator, defining power levels on the radio channel and on predetermined adjacent channels, and analyzing the power levels by the signal analyzer for generating a first result of analysis;

changing attenuation level, attenuating the feed-back signal by the attenuator, defining power levels on the predetermined radio channel and on the predetermined adjacent channels, and analyzing the power levels by the signal analyzer for generating a second result of analysis;

if the first and the second results of analysis are not the same, generating a test alarm; and if the first and second results of analysis are the same, delaying a transmitted signal to derive a reference signal;

comparing the feed-back signal and the reference signal to generate an error vector, and if the error vector is not fulfilling predetermined criteria, generating a test alarm.

2. The method of claim 1, wherein the power levels are defined by frequency selective measuring.

3. The method of claim 1, wherein the analyzing of the power levels is done according to ACLR adjacent channel leakage ratio analysis.

4. The method of claim 1, wherein the changing of the attenuation level is carried out by adjusting a variable attenuator.

5. The method of claim 1, wherein a gain difference between the transmitted signal and the feed-back signal is corrected.

6. A radio transmitter, comprising:
a feedback loop comprising a variable attenuator and a signal analyzer;
transmitting means for transmitting a signal on a predetermined radio channel;
attenuating means, coupled to said transmitting means, for changing attenuation level and for attenuating a feed-back signal;
defining means, coupled to said attenuation means, for defining power levels on the radio channel and on the adjacent channels;
analysis means, coupled to said defining means, for analyzing the power levels to generate first and second results of analysis, and for comparing the first and second results of analysis;
delaying means, coupled to said analyzing means, for delaying a transmitted signal to derive a reference signal; and
comparing means, coupled to said delaying means, for comparing the feedback signal and the reference signal to generate an error vector and means for generating a test alarm.

7. A radio transmitter, comprising:
transmitting means transmitting a signal on a predetermined radio channel;
attenuating means, coupled to said transmitting means, said attenuating means changing attenuation level and attenuating a feedback signal;
defining means, coupled to said attenuating means, said defining means defining power levels on the radio channel and on the adjacent channels;
analyzing means coupled to said defining means, said analyzing means analyzing the power levels to generate first and second results of analysis and for comparing the first and second results of analysis;
delaying means coupled to said analyzing means, said delaying means delaying a transmitted signal to derive a reference signal;
comparing means coupled to said delaying means, said comparing means comparing the feedback signal and the reference signal to generate an error vector; and
alarming means coupled to said comparing means, said alarming means generating a test alarm.

8. The radio transmitter of claim 7, wherein the power levels are defined by frequency selective measuring.

9. The radio transmitter of claim 7, wherein the analyzing of the power levels is done according to ACLR adjacent channel leakage ratio analysis.

10. The radio transmitter of claim 7, wherein the changing of the attenuation level is carried out by adjusting a variable attenuator.

11. The radio transmitter of claim 7, wherein a gain difference between the transmitted signal and a feedback signal is corrected.

12. A base station, comprising:
a feedback loop comprising a variable attenuator and a signal analyzer;
transmitting means for transmitting a signal on a predetermined radio channel;
attenuating means, coupled to said transmitting means, for changing attenuation level and for attenuating the feed-back signal;
defining means, coupled to said attenuation means, for defining power levels on the radio channel and on the adjacent channels;
analyzing means, coupled to said defining means, for analyzing the power levels to generate first and second results of analysis, and for comparing the first and second results of analysis;
delaying means, coupled to said analyzing means, for delaying a transmitted signal to derive a reference signal; and
comparing means, coupled to said delaying means, for comparing the feedback signal and the reference signal to generate an error vector and means for generating a test alarm.

13. The base station of claim 12, wherein the power levels are defined by frequency selective measuring.

14. The base station of claim 12, wherein the power level analysis is carried out according to ACLR adjacent channel leakage ratio analysis.

15. The base station of claim 12, wherein the changing of the attenuation level is carried out by adjusting a variable attenuator.

16. A base station, comprising:
transmitting means transmitting a signal on a predetermined radio channel;
attenuating means coupled to said transmitter means, said attenuating means changing attenuation level and attenuating the feedback signal;
defining means coupled to said attenuating means, said defining means defining power levels on the radio channel and on the adjacent channels;
analyzing means coupled to said defining means, said analyzing means analyzing the power levels to generate first and second results of analysis and for comparing the first and second results of analysis;
delaying means coupled to said analyzing means, said delaying means delaying a transmitted signal to derive a reference signal;
comparing means coupled to said delaying means, said comparing means comparing the feedback signal and the reference signal to generate an error vector; and
alarming means coupled to said comparing means, said alarming means generating a test alarm.

* * * * *